(12) United States Patent
Park et al.

(10) Patent No.: US 10,811,485 B2
(45) Date of Patent: Oct. 20, 2020

(54) ORGANIC LIGHT EMITTING DISPLAY PANEL AND ORGANIC LIGHT EMITTING DISPLAY APPARATUS USING THE SAME

(71) Applicant: LG Display Co., Ltd., Seoul (KR)

(72) Inventors: SeHee Park, Paju-si (KR); PilSang Yun, Paju-si (KR); Jaeyoon Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 14 days.

(21) Appl. No.: 16/219,440

(22) Filed: Dec. 13, 2018

(65) Prior Publication Data

US 2019/0206972 A1 Jul. 4, 2019

(30) Foreign Application Priority Data

Dec. 29, 2017 (KR) .................. 10-2017-0184284

(51) Int. Cl.
*H01L 27/32* (2006.01)
*H01L 51/52* (2006.01)
(Continued)

(52) U.S. Cl.
CPC ....... *H01L 27/3276* (2013.01); *G09G 3/3291* (2013.01); *H01L 27/124* (2013.01);
(Continued)

(58) Field of Classification Search
CPC ............... H01L 27/3276; H01L 27/124; H01L 27/1225; H01L 27/1255; H01L 27/3265;
(Continued)

(56) References Cited

U.S. PATENT DOCUMENTS

2004/0195568 A1* 10/2004 Okumura ............ H01L 27/1237
257/59
2009/0146927 A1* 6/2009 Wan ..................... G09G 3/3225
345/76
(Continued)

*Primary Examiner* — Sitaramarao S Yechuri
(74) *Attorney, Agent, or Firm* — Birch, Stewart, Kolasch & Birch, LLP

(57) ABSTRACT

An organic light emitting display panel can include a substrate; pixels disposed on the substrate; a driving transistor including: a driving active layer, a driving gate electrode overlapping with the driving active layer, a driving first conductor extended from one end of the driving active layer, a driving second conductor extended from the other end of the driving active layer, and a driving first gate insulating film overlapping with the driving active layer; a switching transistor including: a switching active layer, a switching gate electrode overlapping with the switching active layer, a switching first conductor extended from one end of the switching active layer, a switching second conductor extended from the other end of the switching active layer, and a switching first gate insulating film overlapping with the switching active layer; an organic light emitting diode; and a second gate insulating film disposed between the driving and switching gate electrodes of the driving and switching transistors, and the driving first conductor, the driving second conductor, the driving first gate insulating film, the switching first conductor, the switching second conductor and the switching first gate insulating film.

18 Claims, 15 Drawing Sheets

(51) Int. Cl.
*G09G 3/3291* (2016.01)
*H01L 27/12* (2006.01)
*G09G 3/3233* (2016.01)

(52) U.S. Cl.
CPC ...... *H01L 27/3262* (2013.01); *H01L 27/3265* (2013.01); *H01L 27/3272* (2013.01); *H01L 51/5237* (2013.01); *G09G 3/3233* (2013.01); *G09G 2300/0426* (2013.01); *G09G 2300/0439* (2013.01); *H01L 27/3258* (2013.01)

(58) Field of Classification Search
CPC ............. H01L 27/3262; H01L 27/3272; H01L 27/3258; H01L 51/5237; G09G 3/3291; G09G 3/3233; G09G 3/3225; G09G 2300/0439; G09G 2300/0426
See application file for complete search history.

(56) References Cited

U.S. PATENT DOCUMENTS

| | | | |
|---|---|---|---|
| 2015/0014638 A1* | 1/2015 | Kwon | H01L 27/3265 257/40 |
| 2015/0263079 A1* | 9/2015 | Ko | H01L 27/3265 257/40 |
| 2016/0049615 A1* | 2/2016 | Kim | H01L 27/3272 257/40 |
| 2016/0254338 A1* | 9/2016 | Lin | H01L 27/3272 257/40 |
| 2016/0343303 A1* | 11/2016 | Kim | H01L 27/124 |
| 2018/0076238 A1* | 3/2018 | Lim | G02F 1/136213 |

* cited by examiner (a)

(b)

(a)

(a)

(a)

(a)

ORGANIC LIGHT EMITTING DISPLAY PANEL AND ORGANIC LIGHT EMITTING DISPLAY APPARATUS USING THE SAME

CROSS-REFERENCE TO RELATED APPLICATION

This application claims the priority benefit of Korean Patent Application No. 10-2017-0184284, filed in the Republic of Korea on Dec. 29, 2017, all of which is hereby incorporated by reference as if fully set forth herein.

BACKGROUND

Technical Field

The present disclosure relates to an organic light emitting display panel and an organic light emitting display apparatus using the same.

Description of the Related Art

An organic light emitting display apparatus uses a self-light emitting device, and has low power consumption, and thus has been widely used as a flat panel display apparatus.

FIG. 1 is an example view illustrating a cross-section of an organic light emitting display apparatus of the related art.

Each pixel of an organic light emitting display apparatus may basically be operated by two transistors and one capacitor.

For example, each pixel of an organic light emitting display panel of the related art, as shown in FIG. 1, includes a switching transistor Tsw connected with gate and data lines, an organic light emitting diode 30, which includes an anode 31, a light emitting layer 32 and a cathode 33, a driving transistor Tdr connected to the anode 31 and the switching transistor Tsw, and a storage capacitor Cst formed between a gate of the driving transistor Tdr and a source of the driving transistor Tdr.

To improve image uniformity and reliability of the organic light emitting display apparatus, a pixel driver constituting each pixel of the organic light emitting display apparatus may further include a compensation circuit that includes at least one transistor.

As the compensation circuit is further provided in the pixel driver, the pixel driver uses additional lines and additional contact holes. Therefore, an area of the pixel driver may be increased, or all elements may not be provided in the pixel driver which is set to a specific width. Particularly, as the organic light emitting display apparatus is realized with high resolution, a spatial restriction problem is caused by the compensation circuit increasing in size.

For example, an area of the storage capacitor is reduced by the spatial restriction of the compensation circuit, whereby performance of the driving transistor or performance of the compensation circuit may be deteriorated.

Also, an increase of the number of contact holes that are used for the additional circuit elements may cause a process defect.

Even if the compensation circuit is not provided, as the organic light emitting display apparatus is realized with high resolution, problems may still occur in that an area of the storage capacitor is reduced, performance of the driving transistor is deteriorated, a process defect is caused, and a spatial restriction is generated.

Also, in the organic light emitting display panel of the related art, as shown in FIG. 1, a gate insulating film 12 and a gate electrode 13, which constitute each of the driving transistor Tdr and the switching transistor Tsw, are continuously provided on an active layer 11 and formed in a pattern type.

Therefore, during process steps of manufacturing the organic light emitting display panel, if a defect occurs in an etching process for forming the gate electrode 13 and the gate insulating film 12 in a pattern type, a defect may occur in that a first conductor 14 or a second conductor 15 provided at both ends of the active layer 11 is short-circuited from the gate electrode 13 in an area marked with K of FIG. 1.

Also, since the gate electrode 13 and the gate insulating film 12 are continuously formed, heights of the gate electrode 13 and the gate insulating film 12 are increased, whereby a large step difference may occur in an insulating film 16 which covers the gate electrode 13 and the gate insulating film 12. Therefore, a defect may occur in that electrodes provided on the insulating film 16 are disconnected in the area where the step difference has occurred.

BRIEF SUMMARY

The present disclosure has been made in view of the above problems, and an object of the present disclosure is to provide an organic light emitting display panel and an organic light emitting display apparatus using the same, in which a gate electrode of a transistor is formed on a patterned first gate insulating film and a second gate insulating film of a plate shape for covering the first gate insulating film.

In accordance with an aspect of the present disclosure, the above and other objects can be accomplished by the provision of an organic light emitting display panel comprising a substrate partitioned by a plurality of pixels, a driving transistor provided in each of the pixels, a switching transistor connected with a gate electrode of the driving transistor, a passivation film covering the driving transistor and the switching transistor, a planarization film provided on the passivation film, and an organic light emitting diode provided on the planarization film and connected with the driving transistor. Each of the driving transistor and the switching transistor includes an active layer, a first conductor extended from one end of the active layer, a second conductor extended from the other end of the active layer, a first gate insulating film provided on the active layer and patterned to overlap the active layer, a second gate insulating film provided on the substrate to cover the first conductor, the second conductor and the first gate insulating film, and the gate electrode provided on the second gate insulating film to overlap the active layer and the first gate insulating film.

In accordance with another aspect of the present disclosure, there is provided an organic light emitting display apparatus comprising the organic light emitting display panel, a gate driver for supplying a gate pulse to gate lines provided in the organic light emitting display panel, a data driver for supplying a data voltage to data lines provided in the organic light emitting display panel, and a controller for controlling the gate driver and the data driver.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
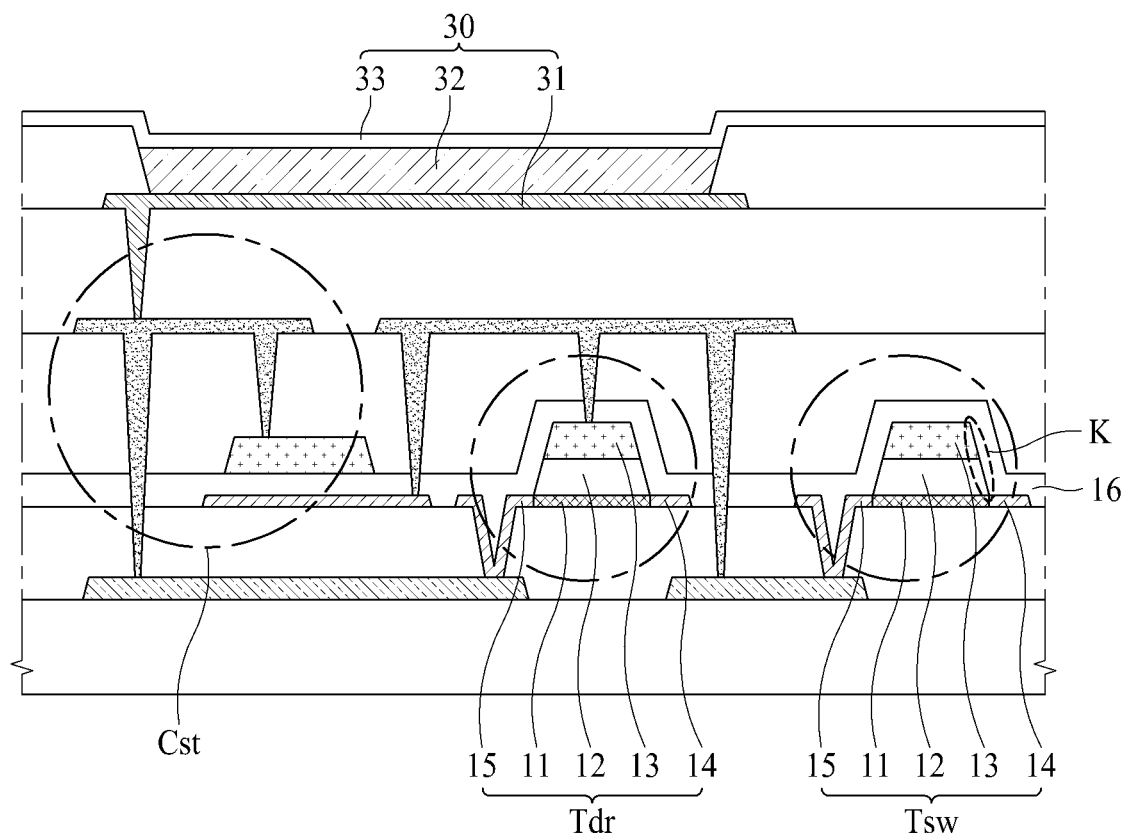
FIG. 1 is an example view illustrating an organic light emitting display panel according to the related art.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

In this specification, wherever possible, the same reference numbers will be used throughout the drawings to refer to the same or like parts.

A shape, a size, a ratio, an angle, and a number disclosed in the drawings illustrating embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when the position relationship is described as "upon," "above," "below," and "next to," one or more portions may be arranged between two other portions unless "just" or "direct" is used.

In describing a time relationship, for example, when the temporal order is described as "after," "subsequent," "next," and "before," a situation which is not continuous may be included unless "just" or "direct" is used.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be performed independently from each other, or may be performed together in co-dependent relationship.

Hereinafter, embodiments of the present disclosure will be described in more detail with reference to the accompanying drawings. Hereinafter, an organic light emitting display panel provided with an N type transistor will be described as an example of the present disclosure. However, the organic light emitting display panel according to an embodiment of the present disclosure may be provided with a P type transistor, or may be provided with a hybrid type of an N type transistor and a P type transistor. Therefore, considering the N type transistor or the P type transistor, various modifications may be made in the following description.

Figure 2:
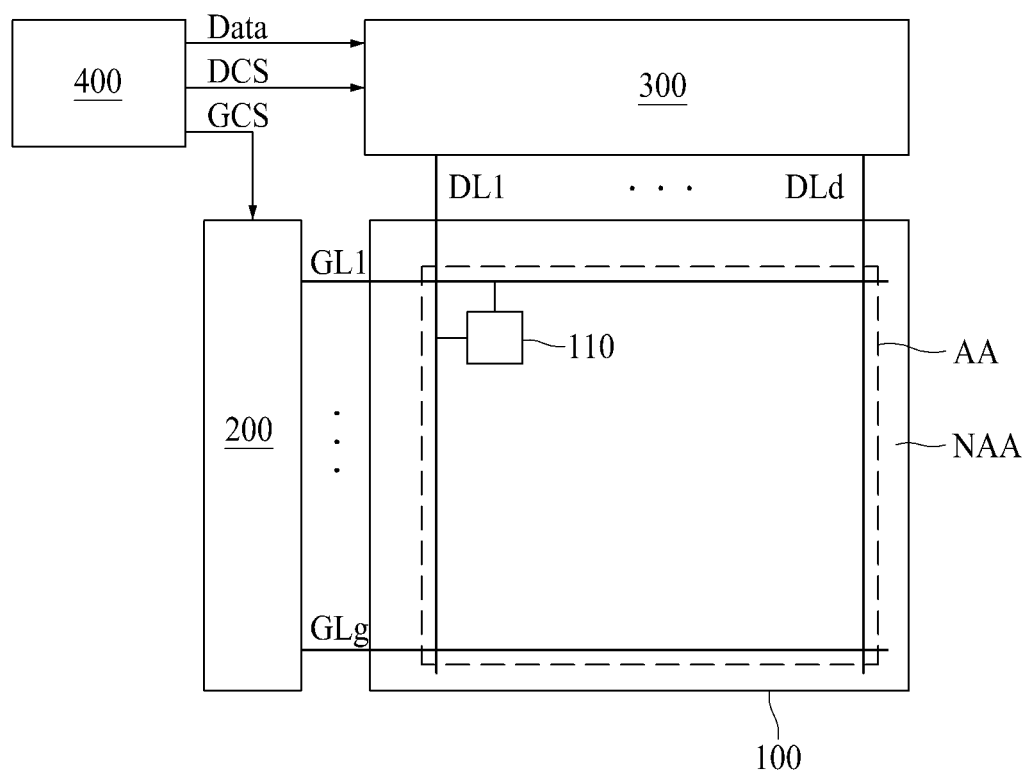
FIG. 2 is a view illustrating an organic light emitting display apparatus according to an embodiment of the present disclosure.
Figure 3:
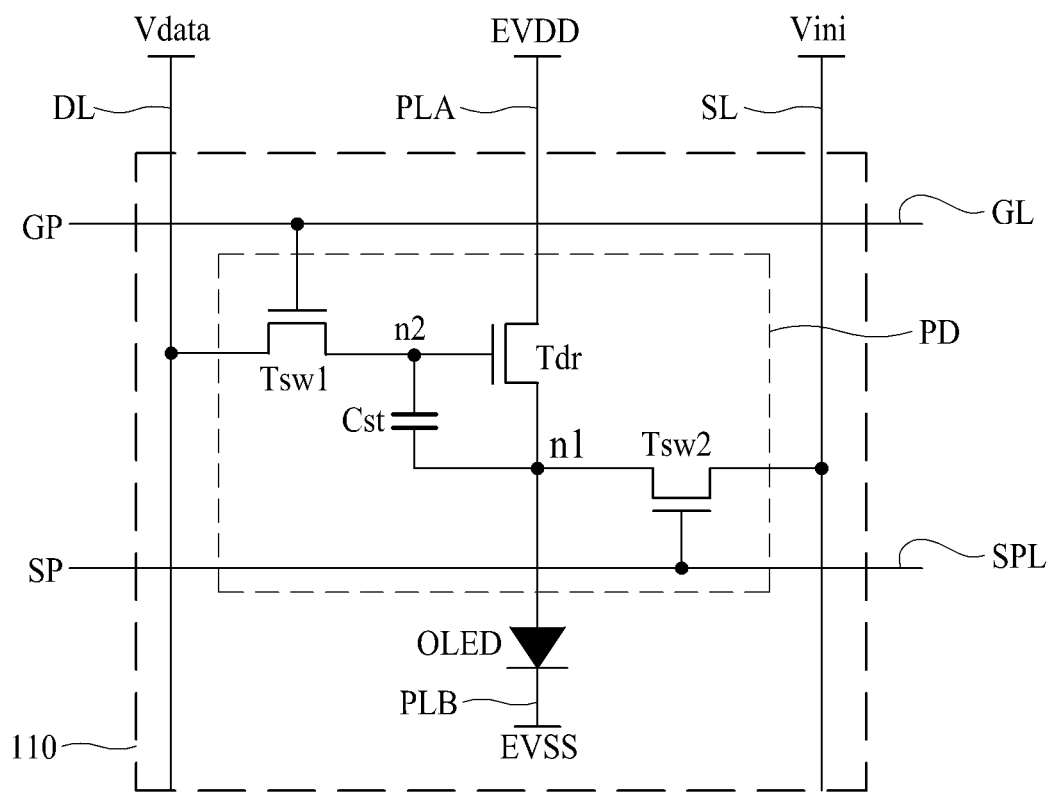
FIG. 3 is a schematic view illustrating a pixel provided in an organic light emitting display panel according to an embodiment of the present disclosure.

FIG. 2 is an example view illustrating an organic light emitting display apparatus according to an embodiment of the present disclosure, and FIG. 3 is a schematic view illustrating a pixel provided in an organic light emitting display panel according to an embodiment of the present disclosure.

The organic light emitting display apparatus according to an embodiment of the present disclosure, as shown in FIG. 2, includes an organic light emitting display panel 100, on which pixels 110 defined by gate lines GL1 to GLg and data lines DL1 to DLd are formed, for outputting an image, a gate driver 200 for sequentially supplying gate pulses to the gate lines GL1 to GLg provided in the organic light emitting display panel 100, a data driver 300 for supplying data voltages to the data lines DL1 to DLd provided in the organic light emitting display panel 100, and a controller 400 for controlling the gate driver 200 and the data driver 300.

A structure and function of the organic light emitting display panel 100 will be described as follows.

The organic light emitting display panel 100 includes the gate lines GL1 to GLg to which the gate pulses are supplied, the data lines DL1 to DLd to which the data voltages are supplied, and pixels 110 defined by the gate lines GL1 to GLg and the data lines DL1 to DLd, in which at least two thin film transistors (hereinafter, simply referred to as transistors) are provided in each of the pixels 110.

Each of the pixels 110 provided in the organic light emitting display panel 100 includes an organic light emitting diode OLED for outputting light, and a pixel driver PD for driving the organic light emitting diode OLED, as shown in FIG. 3.

Signal lines DL, GL, PLA, PLB, SL and SPL for supplying a driving signal to the pixel driver PD are formed in each of the pixels 110.

A data voltage Vdata is supplied to the data line DL, a gate pulse GP is supplied to the gate line GL, a first driving voltage EVDD is supplied to a first voltage supply line PLA, a second driving voltage EVSS is supplied to a second voltage supply line PLB, a sensing voltage Vini is supplied to a sensing line SL, and a sensing pulse SP for turning on or turning off a sensing transistor Tsw2 is supplied to a sensing pulse line SPL. The first driving voltage is supplied from a first driving voltage supply portion, and the second driving voltage is supplied from a second driving voltage supply portion.

The pixel driver PD, as shown in FIG. 3, can include a switching transistor Tsw1 connected with the gate line GL and the data line DL, a driving transistor Tdr for controlling an amount of current output to the organic light emitting diode OLED in accordance with the data voltage Vdata transmitted through the switching transistor Tsw1, and the sensing transistor Tsw2 for sensing characteristics of the driving transistor Tdr. The sensing transistor Tsw2 can be a compensation circuit, and another transistor in addition to the sensing transistor Tsw2 and a capacitor can further be provided in the compensation circuit. The pixel driver PD can further include an emission transistor for controlling a light emitting timing of the driving transistor Tdr and transistors for another purpose in addition to the aforementioned elements.

A storage capacitor Cst is formed between a gate electrode of the driving transistor Tdr and an anode of the organic light emitting diode OLED.

The switching transistor Tsw1 is turned on by the gate pulse supplied to the gate line GL, and thus transmits the data voltage Vdata supplied to the data line DL to the gate electrode of the driving transistor Tdr.

The sensing transistor Tsw2 is connected to a first node n1 between the driving transistor Tdr and the organic light emitting diode OLED and the sensing line SL and thus turned on or turned off by the sensing pulse SP, and senses characteristics of the driving transistor for a sensing period.

A second node n2 connected to the gate electrode of the driving transistor Tdr is connected with the switching transistor Tsw1. The storage capacitor Cst is formed between the second node n2 and the first node n1. If capacitance (hereinafter, simply referred to as storage capacitance) of the storage capacitor Cst is increased, a driving characteristic of the driving transistor Tdr may be improved, and sensing sensitivity of the sensing transistor Tsw2 may be improved.

The pixel driver PD can be formed in various structures by further including a transistor and a capacitor in addition to the structure shown in FIG. 3.

The transistors provided in the pixel driver PD can be comprised of at least one of an oxide thin film transistor, an amorphous silicon thin transistor, a polysilicon thin film transistor, and a low temperature polysilicon thin film transistor.

The transistor can also be provided in a non-display area NAA outside a display area AA where the pixels are provided. For example, if the gate driver 200 is embedded in the non-display area NAA of the organic light emitting display panel 100 and the transistors provided in the pixel driver PD are comprised of oxide thin film transistors, the transistors constituting the gate driver 200 can also be comprised of the oxide thin film transistors. Therefore, all the transistors provided in the organic light emitting display panel can be generated by the same manufacturing process.

Hereinafter, a detailed structure of the organic light emitting display panel 100 according to an embodiment of the present disclosure will be described in detail with reference to FIGS. 3 to 10B.

A function of the controller 400 is as follows.

The controller 400 outputs a gate control signal GCS for controlling the gate driver 200 and a data control signal DCS for controlling the data driver 300 by using timing signals supplied from an external system, for example, a vertical synchronization signal, a horizontal synchronization signal and a clock. The controller 400 realigns input image data input from the external system after sampling the input image data, and supplies the realigned digital image data Data to the data driver 300.

A function of the data driver 300 is as follows.

The data driver 300 converts the image data Data input from the controller 400 to an analog data voltage and transmits data voltages Vdata of one horizontal line to the data lines DL1 to DLd per one horizontal period where the gate pulse GP is supplied to the gate line GL.

A function of gate driver 200 is as follows.

The gate driver 200 sequentially supplies the gate pulse to the gate lines GL1 to GLg of the organic light emitting display panel 100 in response to the gate control signal GCS input from the controller 400. Therefore, the switching transistors Tsw1 formed in each pixel to which the gate pulse is input may be turned on, whereby an image may be output to each pixel 110. The gate driver 200 can be formed independently from the organic light emitting display panel 100, and can be electrically connected with the organic light emitting display panel 100 in various manners. The gate driver 200 can be provided in a gate in panel (GIP) manner in which the gate driver 200 is packaged in the organic light emitting display panel 100.

In the aforementioned description, although the data driver 300, the gate driver 200 and the controller 400 are provided independently, at least any one of the data driver 300 and the gate driver 200 can be provided in a single body with the controller 400.

Figure 4:
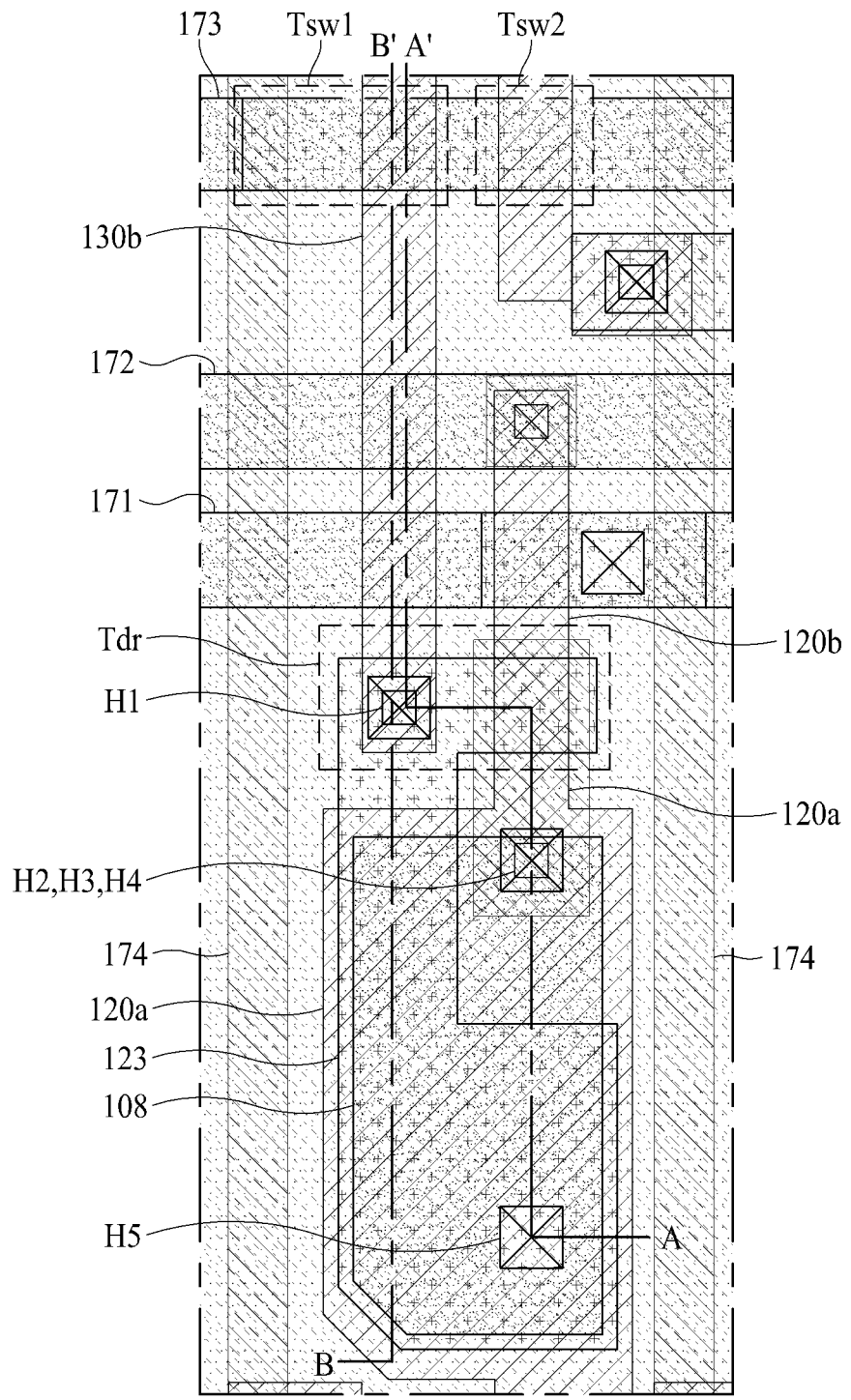
FIG. 4 is a plane view illustrating a pixel provided in an organic light emitting display panel according to an embodiment of the present disclosure.
Figure 5A:
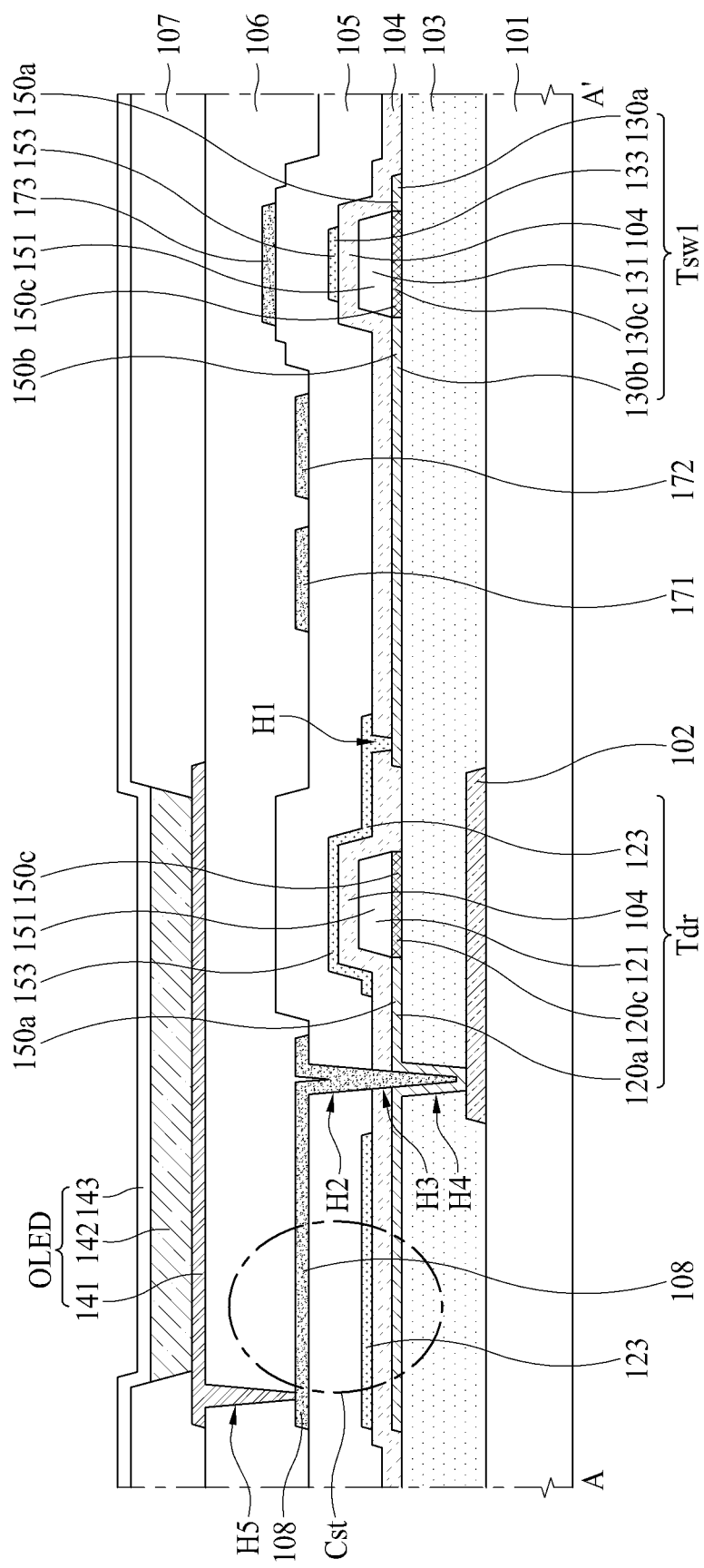
FIG. 5A is a view illustrating a cross-section taken along line A-A' shown in FIG. 4 according to an embodiment of the present disclosure.
Figure 5B:
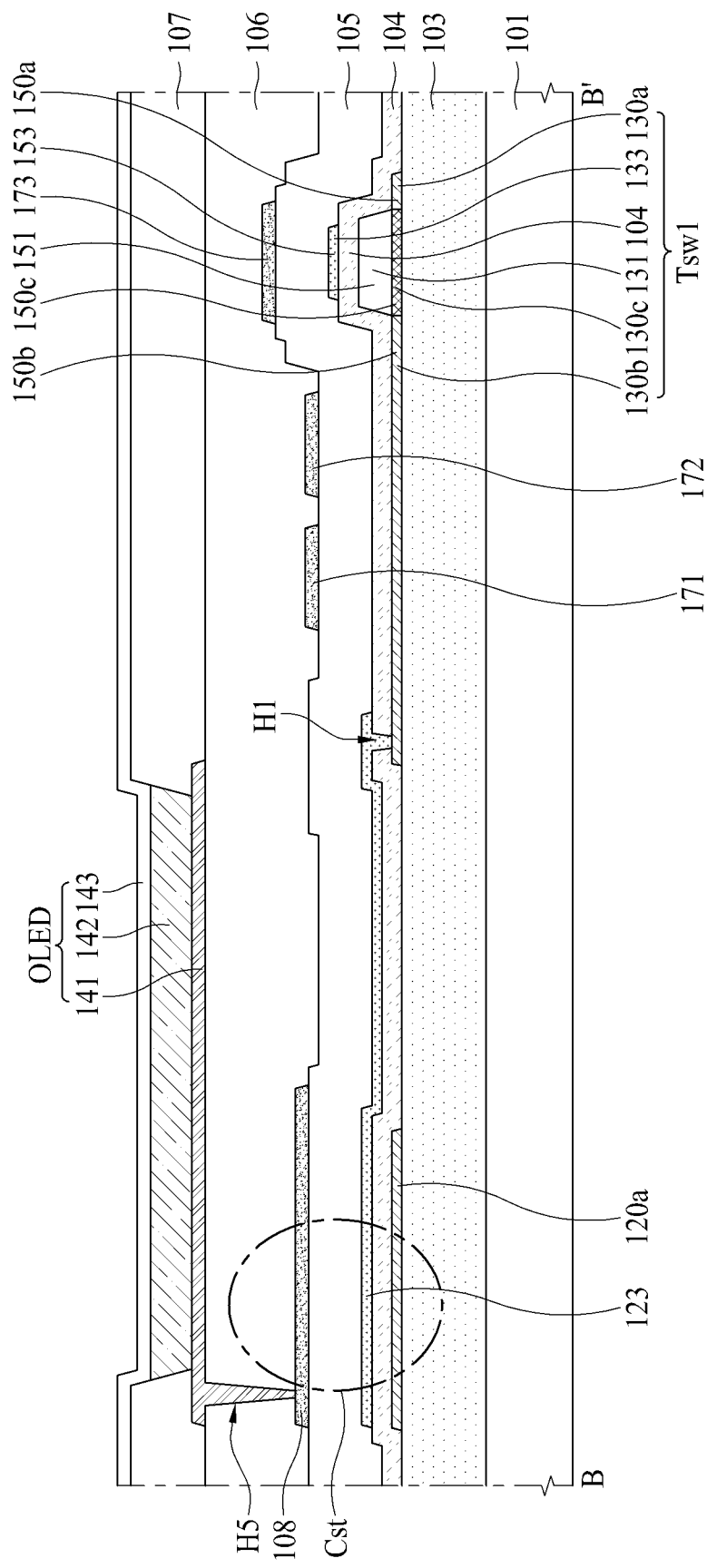
FIG. 5B is a view illustrating a cross-section taken along line B-B' shown in FIG. 4 according to an embodiment of the present disclosure.

FIG. 4 is a plane view illustrating a pixel provided in an organic light emitting display panel according to an embodiment of the present disclosure, FIG. 5A is an example view illustrating a cross-section taken along line A-A' shown in FIG. 4, and FIG. 5B is an example view illustrating a cross-section taken along line B-B' shown in FIG. 4. Hereinafter, an organic light emitting display panel comprised of transistors which use an oxide semiconductor layer will be described as an example of the present disclosure.

The organic light emitting display panel 100 according to an embodiment of the present disclosure, as shown in FIGS. 3 to 5B, includes a substrate 101 partitioned by a plurality of pixels 110, a driving transistor Tdr provided in each of the pixels 110, a switching transistor Tsw1 connected with the gate electrode of the driving transistor Tdr, a passivation film 105 for covering the driving transistor Tdr and the switching transistor Tsw1, a planarization film 106 provided on the passivation film 105, and an organic light emitting diode OLED provided on the planarization film 106 and connected with the driving transistor Tdr.

Particularly, in embodiments of the present disclosure, each of the driving transistor Tdr and the switching transistor Tsw1 includes an active layer 150*c*, a first conductor 150*a* extended from one end of the active layer 150*c*, a second conductor 150*b* extended from the other end of the active layer 150c, a first gate insulating film 151 patterned to overlap the active layer 150c, a second gate insulating film 104 provided on the substrate 101 to cover the first conductor 150a, the second conductor 150b and the first gate insulating film 151, and a gate electrode 153 provided on the second gate insulating film 104 to overlap the active layer 150c and the gate insulating film 151.

In addition to the aforementioned elements, the pixel 110 of the organic light emitting display panel 100 can further include a light shield 102 for shielding light entering the driving transistor Tdr, a buffer 103 provided between the driving transistor Tdr and the light shield 102, a storage capacitor electrode 108 for forming a storage capacitor Cst together with the gate electrode 153 of the driving transistor Tdr, and a sensing transistor Tsw2 for sensing characteristic change of the driving transistor Tdr. Hereinafter, the elements provided in the pixel will be described in due order.

First of all, the substrate 101 can be a glass substrate, or a plastic substrate. A plurality of pixels 110 are provided in the substrate 101.

Next, the driving transistor Tdr is provided on the substrate 101. The driving transistor Tdr is formed in a top gate type.

The driving transistor Tdr includes a driving active layer 120c used as the active layer 150c, a driving first conductor 120a used as the first conductor 150a and connected with the organic light emitting diode OLED, a driving second conductor 120b used as the second conductor 150b, a driving first gate insulating film 121 used as the first gate insulating film 151, and a driving gate electrode 123 used as the gate electrode 153, and the second gate insulating film 104. Since the driving second conductor 120b is not included in the cross-section of line A-A' of FIG. 4, the second conductor 120b is omitted from the view shown in FIG. 5A.

For example, the driving active layer 120c, the driving second conductor 120b and the driving first conductor 120a, which constitute the driving transistor Tdr, can be provided between the second gate insulating film 104 and the substrate 101. In FIG. 5A, the organic light emitting display panel in which a buffer 103 is further provided between the second gate insulating film 104 and the substrate 101 is provided. In this situation, the driving active layer 120c, the driving second conductor 120b and the driving first conductor 120a can be provided on the buffer 103.

In embodiments of the present disclosure, the active layer 150c, the first conductor 150a, the second conductor 150b, the first gate insulating film 151 and the gate electrode 153 are respectively provided in the driving transistor Tdr and the switching transistor Tsw1.

Therefore, the active layer 150c, the first conductor 150a, the second conductor 150b, the first gate insulating film 151 and the gate electrode 153, which are provided in the driving transistor Tdr, are respectively referred to as the driving active layer 120c, the driving first conductor 120a, the driving second conductor 120b, the driving first gate insulating film 121 and the driving gate electrode 123.

Also, the active layer 150c, the first conductor 150a, the second conductor 150b, the first gate insulating film 151 and the gate electrode 153, which are provided in the switching transistor Tsw1, are respectively referred to as a switching active layer 130c, a switching first conductor 130a, a switching second conductor 130b, a switching first gate insulating film 131 and a switching gate electrode 133.

Since the second gate insulating film 104 is commonly applied to the driving transistor Tdr and the switching transistor Tsw1, the second gate insulating film 104 is not divided into separate names with regard to the driving transistor Tdr and the switching transistor Tsw1, since the second gate insulating film 104 is distributed across both the driving transistor Tdr and the switching transistor Tsw1 in a sheet like shape or plate type shape (e.g., as a common layer).

The driving active layer 120c is formed of an oxide semiconductor. The driving first conductor 120a and the driving second conductor 120b are conductors modified from the oxide semiconductor. For example, after the oxide semiconductor is formed in the area corresponding to the driving active layer 120c, the driving first conductor 120a and the driving second conductor 120b, if plasma is injected into the area corresponding to the driving first conductor 120a and the driving second conductor 120b, the oxide semiconductor is conductorized, whereby the driving first conductor 120a and the driving second conductor 120b are formed.

The driving first conductor 120a is electrically connected with an anode 141 constituting the organic light emitting diode OLED. In FIG. 5A, the organic light emitting display panel 100 in which the driving first conductor 120a is electrically connected with the anode 141 through the storage capacitor electrode 108 is shown.

Although the driving second conductor 120b is connected with the first driving voltage supply portion through the first voltage supply line (PLA) 172, since the driving second conductor 120b is connected to the first voltage supply line (PLA) 172 in an area other than the cross-section taken along line A-A' of FIG. 4, the connection between the driving second conductor 120b and the first voltage supply line (PLA) 172 cannot be seen in the view shown in FIG. 5A. In FIGS. 4, 5A and 5B, a reference number 171 is an emission control line connected with a gate of the emission transistor described as above. A control signal that can turn on or turn off the emission transistor can be supplied to the gate of the emission transistor through the emission control line 171.

The driving first gate insulating film 121 is provided on the driving active layer 120c to overlap the driving active layer 120c and patterned.

In this instance, as shown in FIG. 5, the patterned driving first gate insulating film 121 means that the driving first gate insulating film 121 is formed in only a specific area of the substrate 101, that is, an area overlapped with the driving active layer 120c.

The driving first gate insulating film 121 can be formed of an organic material or an inorganic material.

The second gate insulating film 104 is provided on the driving first gate insulating film 121 to cover all of the driving first gate insulating film 121, the driving active layer 120c, the driving second conductor 120b, and the driving first conductor 120a (e.g., the second gate insulating film 104 can be formed as a common layer).

The second gate insulating film 104 is provided on an entire surface of the display area AA of the organic light emitting display panel in a plate shape (e.g., in a sheet form in order to cover circuit elements in a blanket manner). Therefore, the second gate insulating film 104 covers all of the patterned first gate insulating film 151 provided in the driving transistor Tdr, that is, the driving first gate insulating film 121, and the patterned first gate insulating film 151 provided in the switching transistor Tdr, that is, the switching first gate insulating film 131.

In addition, although the first gate insulating film 151 constituting the driving transistor Tdr and the first gate insulating film 151 constituting the switching transistor Tsw1 are formed in only the area overlapped with the active layer 150c, the second gate insulating film 104 is formed on the entire surface of the display area of the substrate in a plate shape to cover the patterned first gate insulating films 151 of the transistors.

The second gate insulating film 104 is formed of an organic material or an inorganic material. In this instance, the material that forms the second gate insulating film 104 can be the same as or different from the material that forms the first gate insulating film 151.

For example, each of the second gate insulating film 104 and the first gate insulating film 151 can be formed of any one of insulating materials, such as $SiO_2$, HfOx, ZrOx, $Al_2O_3$, and SiNx. Particularly, the second gate insulating film 104 and the first gate insulating film can be formed of $SiO_2$.

The driving gate electrode 123 is provided on the second gate insulating film 104 to overlap the first driving gate insulating film 121.

The driving gate electrode 123 and the driving first conductor 120a are overlapped with each other by interposing the second gate insulating film 104 therebetween. The driving gate electrode 123 and the driving first conductor 120a overlap with each other and form the storage capacitor Cst. Since the driving gate electrode 123 is not formed near a fourth contact hole 114 in line A-A' of FIG. 4, the driving gate electrode 123 appears disjointed in the view shown in FIG. 5A. However, since the driving gate electrode 123 is continuously formed in line B-B' of FIG. 4, the driving gate electrode 123 is continuously formed in FIG. 5B, and the view in FIG. 5B shows how the driving gate electrode 123 of driving transistor Tdr is used to also form part of the storage capacitor Cst.

The driving gate electrode 123 is connected with the second conductor 150b of the switching transistor Tsw1, that is, the switching second conductor 130b, through a first contact hole H1 provided on the second gate insulating film 104.

Next, the switching transistor Tsw1 is provided on the substrate 101. The switching transistor Tsw1 is formed in a top gate type.

The switching transistor Tsw1 includes a switching active layer 130c used as the active layer 150c, a switching first conductor 130a used as the first conductor 150a, a switching second conductor 130b used as the second conductor 150b, a switching first gate insulating film 131 used as the first gate insulating film 151, and a switching gate electrode 133 used as the second gate insulating film 104 and the gate electrode 153.

For example, the switching active layer 130c, the switching second conductor 130b and the switching first conductor 130a, which constitute the switching transistor Tsw1, can be provided between the second gate insulating film 104 and the substrate 101. In FIG. 5A, the organic light emitting display panel in which a buffer 103 is further provided between the second gate insulating film 104 and the substrate 101 is provided. In this situation, the switching active layer 120c, the switching second conductor 130b and the switching first conductor 130a can be provided on the buffer 103.

As described above, in embodiments of the present disclosure, the active layer 150c, the first conductor 150a, the second conductor 150b, the first gate insulating film 151 and the gate electrode 153 are respectively provided in the driving transistor Tdr and the switching transistor Tsw1.

Therefore, the active layer 150c, the first conductor 150a, the second conductor 150b, the first gate insulating film 151 and the gate electrode 153, which are provided in the driving transistor Tdr, are respectively referred to as the driving active layer 120c, the driving first conductor 120a, the driving second conductor 120b, the driving first gate insulating film 121 and the driving gate electrode 123. Also, the active layer 150c, the first conductor 150a, the second conductor 150b, the first gate insulating film 151 and the gate electrode 153, which are provided in the switching transistor Tsw1, are respectively referred to as the switching active layer 130c, the switching first conductor 130a, the switching second conductor 130b, the switching first gate insulating film 131 and the switching gate electrode 133.

The switching active layer 130c is formed of an oxide semiconductor. The switching first conductor 130a and the switching second conductor 130b are conductors modified from the oxide semiconductor. For example, after the oxide semiconductor is formed in the area corresponding to the switching active layer 130c, the switching first conductor 130a and the switching second conductor 130b, if plasma is injected into the area corresponding to the switching first conductor 130a and the switching second conductor 130b, the oxide semiconductor is conductorized, whereby the switching first conductor 130a and the switching second conductor 130b are formed.

The switching second conductor 130b is connected with the driving gate electrode 123. Thus, a first contact hole H1 is provided on the second gate insulating film 104, and the switching second conductor 130b is connected with the driving gate electrode 123 through the first contact hole H1.

Although the switching first conductor 130a is connected with the data line (DL) 174, the data line (DL) 174 is not included in the cross-section taken along line A-A' of FIG. 4, and thus not included in this view.

The switching first gate insulating film 131 is provided on the switching active layer 130c to overlap the switching active layer 123c and patterned. In this instance, as shown in FIG. 5A, the patterned switching first gate insulating film 131 means that the switching first gate insulating film 131 is formed in only a specific area of the substrate 101, that is, an area overlapped with the switching active layer 130c.

The switching first gate insulating film 131 can be formed of an organic material or an inorganic material.

The second gate insulating film 104 is provided on the switching first gate insulating film 131 to cover all of the switching first gate insulating film 131, the switching active layer 130c, the switching second conductor 130b, and the switching first conductor 130a.

As described above, the second gate insulating film 104 is provided on the entire surface of the display area AA of the organic light emitting display panel in a plate shape, and is commonly applied to the driving transistor Tdr and the switching transistor Tsw1 (e.g., the second gate insulating film 104 can be formed in sheet shape or plate-type shape, in order to be a common layer that covers various elements in a blanket like manner).

Therefore, the second gate insulating film 104 covers all of the patterned first gate insulating film 151 provided in the driving transistor Tdr, that is, the driving first gate insulating film 121, and the patterned first gate insulating film 151 provided in the switching transistor Tdr, that is, the switching first gate insulating film 131.

The second gate insulating film 104 is formed of an organic material or an inorganic material. In this instance, the material that forms the second gate insulating film 104 can be the same as or different from the material that forms the first gate insulating film 151.

The switching gate electrode 133 is provided on the second gate insulating film 104 to overlap the switching first gate insulating film 131.

Although the switching gate electrode 133 is connected with the gate line (GL) 173, since the gate line (GL) 173 is connected with the switching gate electrode 133 in an area other than the cross-section taken along line A-A' of FIG. 4, the connection between the switching gate electrode 133 and the gate line (GL) 173 is not viewable in the view shown in FIG. 5A.

Next, the passivation film 105 covers the driving gate electrode 123, the switching gate electrode 133 and the second gate insulating film 104. The passivation film 105 is formed of an organic material or an inorganic material, and can be comprised of at least one layer.

The planarization film 106 is provided on the passivation film 105. The planarization film 106 is formed of an organic material or an inorganic material, and can be comprised of at least one layer.

The planarization film 106 can serve to planarize upper ends of the driving transistor Tdr and the switching transistor Tsw1.

Next, the organic light emitting diode OLED is provided on the planarization film 106, and is connected with the driving first conductor 120a of the driving transistor Tdr.

The organic light emitting diode OLED includes an anode 141, a light emitting layer 142 and a cathode 143.

The anode 141 constituting the organic light emitting diode OLED is connected with the driving first conductor 120a. The organic light emitting diode OLED is surrounded by a bank 107. The pixels may respectively be partitioned by the bank 107.

Next, the storage capacitor electrode 108 is provided on the passivation film 105, and forms the storage capacitor Cst together with the driving gate electrode 123.

The storage capacitor electrode 108 is connected with the driving first conductor 120a. Thus, a second contact hole H2 is provided on the passivation film 105, and a third contact hole H3 is provided on the second gate insulating film 104. The storage capacitor electrode 108 is connected with the driving first conductor 120a through the second contact hole H2 and the third contact hole H3.

The storage capacitor electrode 108 connects the driving first conductor 120a with the organic light emitting diode OLED. Thus, a fifth contact hole H5 is formed on the planarization film 106. The anode 141 is connected with the storage capacitor electrode 108 through the fifth contact hole H5, and the storage capacitor electrode 108 is connected with the driving first conductor 120a through the second contact hole H2 and the third contract hole H3. Therefore, the anode 141 can be connected with the driving first conductor 120a.

Finally, the light shield 102 can be provided in an area of the substrate 101, which corresponds to the driving transistor Tdr. A buffer layer can be provided between the light shield 102 and the substrate 101. The light shield 102 is made of metal.

The light shield 102 is covered by the buffer 103, and the driving first conductor 120a, the driving second conductor 120b, the driving active layer 120c, the switching first conductor 130a, the switching second conductor 130b and the switching active layer 130c are provided on the buffer 103.

The buffer 103 is formed of an organic material or an inorganic material, and may be formed of at least one layer.

Since characteristics of the driving transistor Tdr may be changed if the light shield 102 is floated and not connected with the other electrodes, the light shield 102 can be connected with the driving first conductor 120a. Thus, a fourth contact hole H4 is formed on the buffer 103, and the driving first conductor 120a can be connected with the light shield 102 through the fourth contact hole H4.

Figure 6:
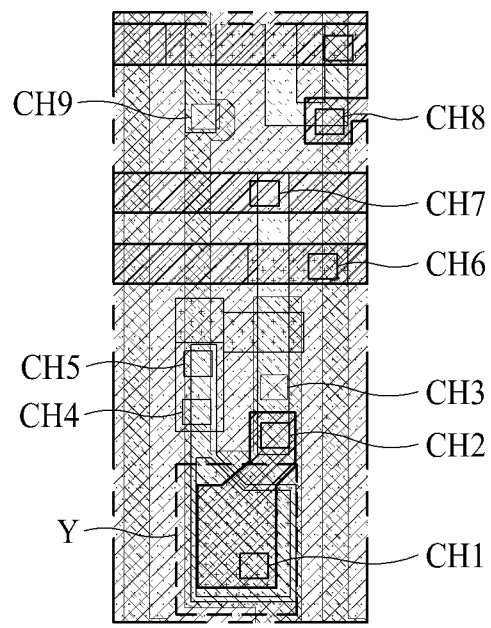
FIG. 6 is a plane view illustrating a pixel provided in an organic light emitting display panel according to an embodiment of the present disclosure and a plane view of a pixel provided in an organic light emitting display panel of the related art.
Figure 6:
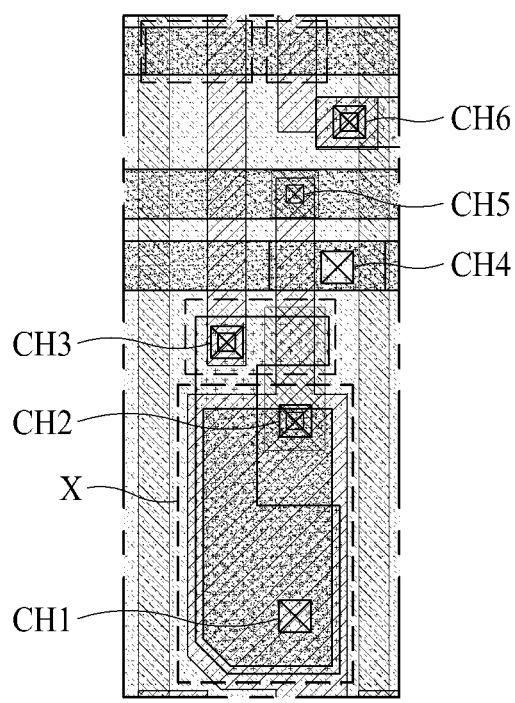

FIG. 6 is an example view illustrating a plane of a pixel provided in an organic light emitting display panel according to an embodiment of the present disclosure and a plane of a pixel provided in an organic light emitting display panel of the related art. In FIG. 6, (a) is an example view illustrating a plane of a pixel provided in the organic light emitting display panel of the related art, and (b) is an example view illustrating a plane of a pixel provided in the organic light emitting display panel according to an embodiment of the present disclosure. Particularly, (b) of FIG. 6 illustrates the same plane as that shown in FIG. 4.

In the organic light emitting display panel 100 according to an embodiment of the present disclosure, as described with reference to FIGS. 2 to 5B, the number of contact holes can be reduced as compared with the organic light emitting display panel of the related art (e.g., nine contact holes in the pixel of the related art vs. six contact holes in the embodiment in (b) of FIG. 6). That is, even in the situation that the organic light emitting display panel of the related art shown in FIG. 1 is compared with the organic light emitting display panel 100 according to an embodiment of the present disclosure shown in FIG. 5A, the number of contact holes of the organic light emitting display panel 100 according to an embodiment of the present disclosure is less than the number of contact holes of the organic light emitting display panel of the related art. In the organic light emitting display panel 100 according to an embodiment of the present disclosure, as described above, the storage capacitor electrode 108 and the driving gate electrode 123 can form the storage capacitor Cst, and the driving first conductor 120a and the driving gate electrode 123, which are connected with the storage capacitor electrode 108, can form the storage capacitor Cst. In other words, the driving gate electrode 123 can serve a dual purpose, such as acting a gate electrode for the driving transistor Tdr and being used as an electrode for the storage capacitor Cst, which reduces complexity and reduces the number of contact holes for the pixel.

As described above, in the organic light emitting display panel according to an embodiment of the present disclosure, the number of contact holes can be reduced, whereby areas of the driving first conductor 120a and the driving gate electrode 123 can be increased as compared with the related art.

In addition, for example, although nine contact holes CH1 to CH9 are formed in the pixel provided in the organic light emitting display panel shown in (a) of FIG. 6, six contact holes CH1 to CH6 are formed in the pixel provided in the organic light emitting display panel according to an embodiment of the present invention shown in (b) of FIG. 6.

That is, in the pixels of (a) and (b) in which diodes for performing the same function, three contact holes can be reduced in the pixel shown in (b) provided in the organic light emitting display panel according to an embodiment of the present invention as compared with the pixel of the related art shown in (a).

As the three contact holes are reduced, an area where the three contact holes were previously formed can now be used for other purposes, for example, for the areas of the driving first conductor 120a and the driving gate electrode 123. Therefore, an area X of the storage capacitor of the organic light emitting display panel 100 according to an embodiment of the present disclosure shown in (b) of FIG. 6 can be made much larger than an area Y of the storage capacitor of the organic light emitting display panel of the related art shown in (a) of FIG. 6.

As the area of the storage capacitor Cst is increased, performance of the driving transistor Tdr and performance of the sensing transistor Tsw2 can be improved.

FIGS. 7A to 10B are example views illustrating a method for manufacturing an organic light emitting display panel according to an embodiment of the present disclosure. In FIGS. 7A to 10B, FIGS. 7A, 8A, 9A and 10A illustrate plane views of a pixel 110 provided in the organic light emitting display panel, particularly, planes as shown in FIG. 4 and (b) of FIG. 6. Also, in FIGS. 7A to 10B, FIGS. 7B, 8B, 9B and 10B illustrate cross-sections of the pixel 110, which is taken along line A-A' of FIG. 4. Hereinafter, methods for forming the cross-section shown in FIG. 5A and the planes shown in FIG. 4 and (b) of FIG. 6 will be described with reference to FIGS. 7A to 10B. In the following description, description the same as or similar to the description made with reference to FIGS. 2 to 6 will be omitted or briefly described.

Figure 7A:
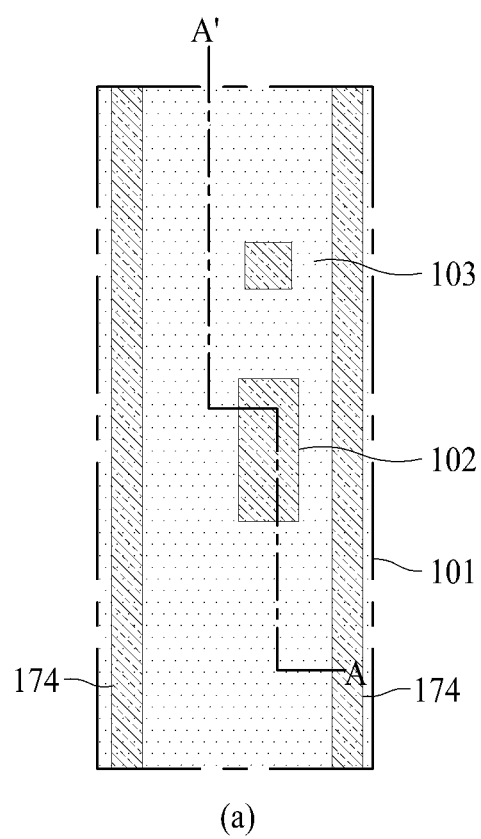
FIGS. 7A, 7B, 8A, 8B, 9A, 9B, 10A and 10B are example views illustrating a method for manufacturing an organic light emitting display panel according to an embodiment of the present disclosure.
Figure 7B:
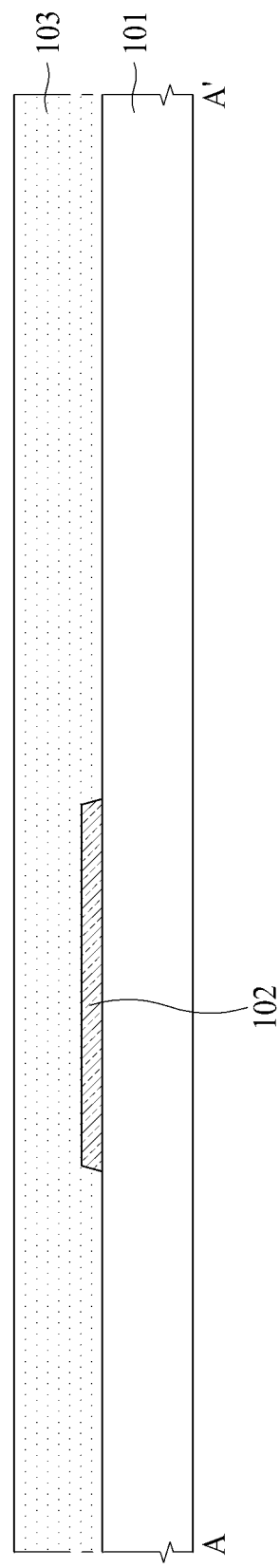

First, as shown in FIGS. 7A and 7B, a metal material is provided on the substrate 101, and the light shield 102 is formed by the metal material. As shown in FIG. 7A, lines used as various wires as well as the light shield 102 formed at a lower end of the driving transistor Tdr can be formed on the substrate 101 by the metal material. For example, the data line (DL) 174 can be formed on the substrate 101 together with the light shield 102.

The light shield 102 and the lines, which are formed of the metal material, are covered by the buffer 103.

Figure 8A:
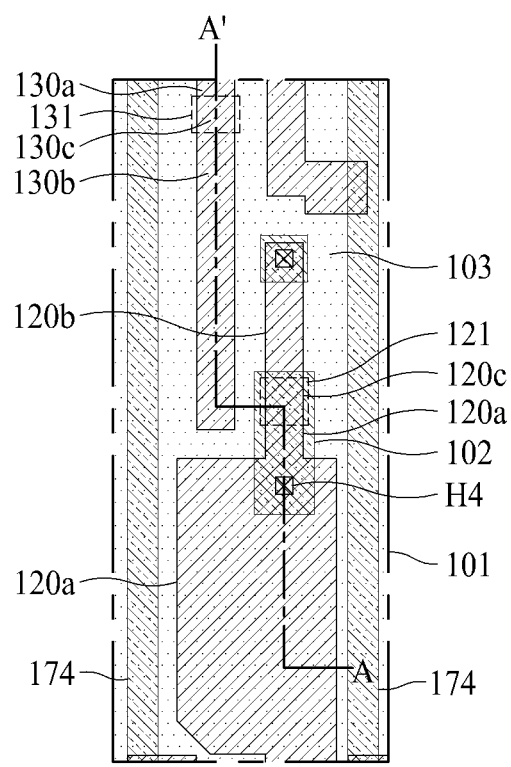
Figure 8B:
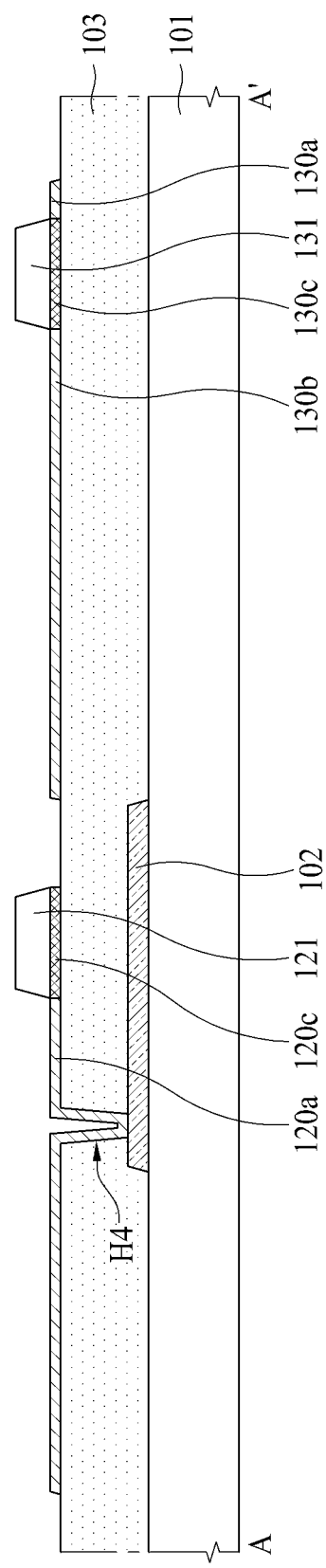

Next, as shown in FIGS. 8A and 8B, a fourth contact hole H4 for partially exposing the light shield 102 is formed on the buffer 103.

An oxide semiconductor is formed on the buffer 103, and is connected with the light shield 102 through the fourth contact hole H4.

The driving first gate insulating film 121 and the switching first gate insulating film 131 are formed to be patterned on the oxide semiconductor.

If plasma is irradiated into the oxide semiconductor using the driving first gate insulating film 121 and the switching first gate insulating film 131 as masks, the oxide semiconductor is changed to a conductor.

Since an area overlapped with the driving first gate insulating film 121 and the switching first gate insulating film 131 of the oxide semiconductor is not affected by plasma, the area is maintained as the oxide semiconductor and becomes the driving active layer 120c and the switching active layer 130c.

The conductorized area of the oxide semiconductor includes the driving first conductor 120a, the driving second conductor 120b, the switching first conductor 130a and the switching second conductor 130b.

That is, in embodiments of the present disclosure, the driving first conductor 120a, the driving second conductor 120b, the switching first conductor 130a and the switching second conductor 130b are formed by the driving first gate insulating film 121 and the switching first gate insulating film 131.

Therefore, the driving first conductor 120a, the driving second conductor 120b, the driving active layer 120c, the switching first conductor 130a, the switching second conductor 130b and the switching active layer 130c are provided on the buffer 103.

The driving first conductor 120a is connected with the light shield 102 through the fourth contact hole H4.

Figure 9A:
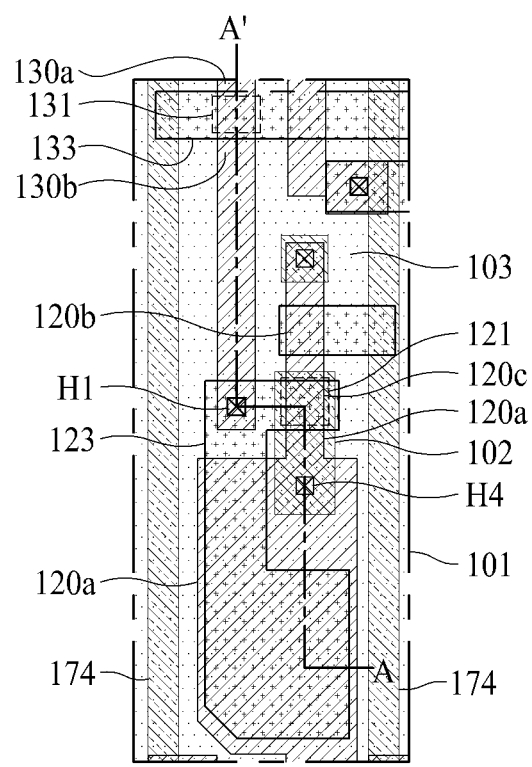
Figure 9B:
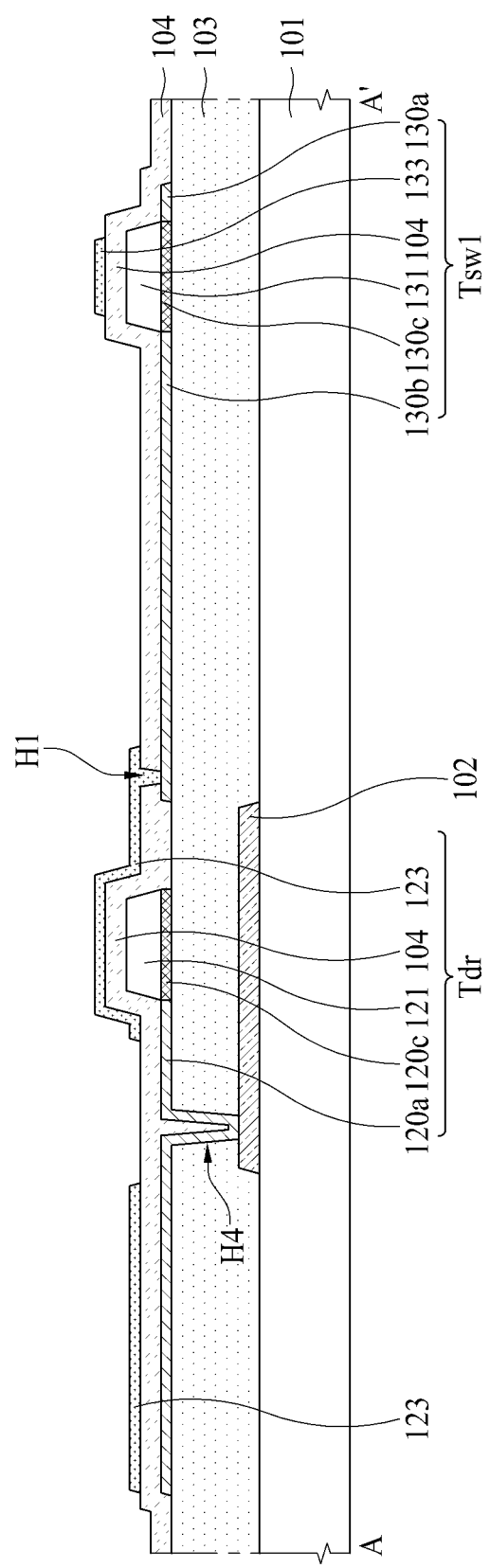

Next, as shown in FIGS. 9A and 9B, the buffer 103, the driving first conductor 120a, the driving second conductor 120b, the driving active layer 120c, the switching first conductor 130a, the switching second conductor 130b and the switching active layer 130c are covered by the second gate insulating film 104 (e.g., the second gate insulating film 104 can be applied in a sheet form or plate-type in order to cover circuit elements in a blanket manner).

The first contact hole H1 is formed on the second gate insulating film 104.

The driving gate electrode 123 and the switching gate electrode 133 are provided on the second gate insulating film 104.

The driving gate electrode 123 is connected with the switching second conductor 120b through the first contact hole H1.

Figure 10A:
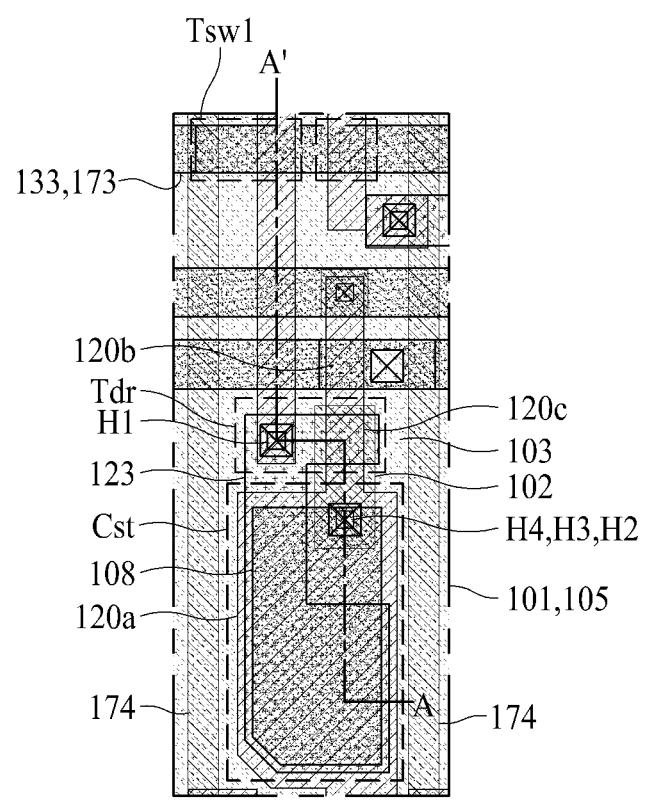
Figure 10B:
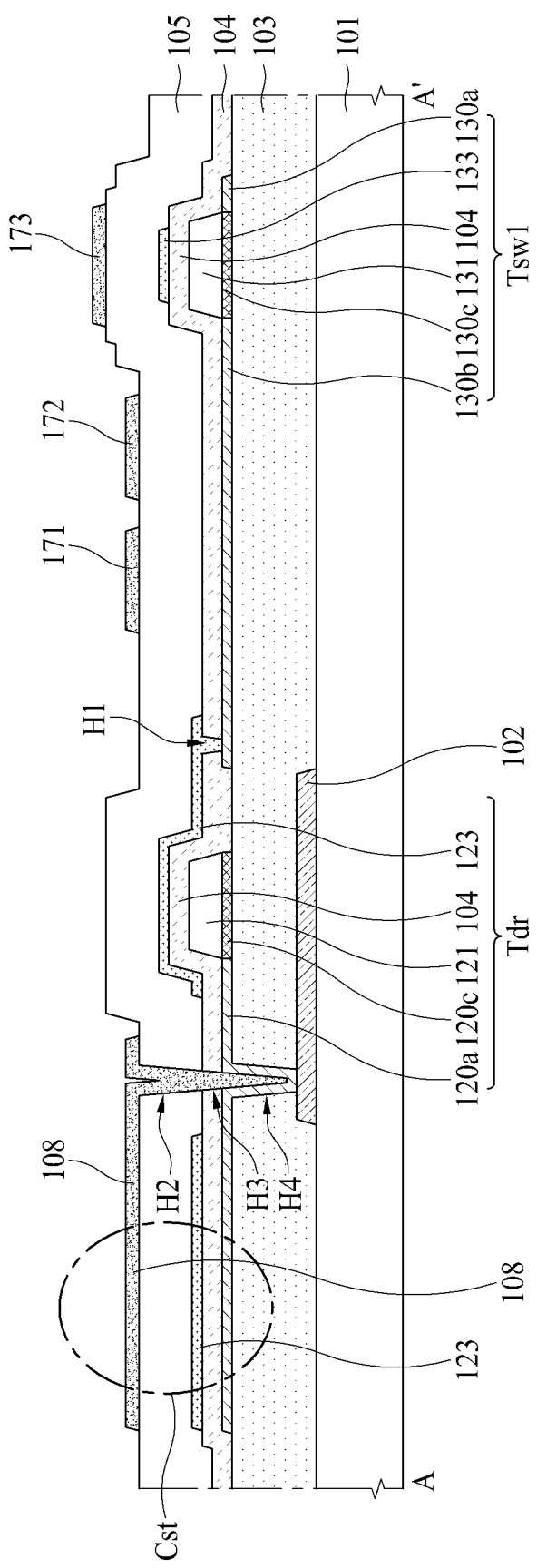

Next, as shown in FIGS. 10A and 10B, the passivation film 105 is formed on the second gate insulating film 104, the driving gate electrode 123 and the switching gate electrode 133.

A second contact hole H2 for partially exposing the second gate insulating film 104 is formed on the passivation film 105, and a third contact hole H3 for partially exposing the driving first conductor 120a is formed on the second gate insulating film 104. The driving first conductor 120a is partially exposed by the second contact hole H2 and the third contact hole H3.

In addition to the second contact hole H2 and the third contact hole H3, contact holes used for various purposes are formed on the passivation film 105 and the second gate insulating film 104.

A storage capacitor electrode 108 is formed on the passivation film 105. The storage capacitor electrode 108 is connected with the driving first conductor 120a through the second contact hole H2 and the third contact hole H3.

The storage capacitor electrode 108 is arranged to overlap the first driving first conductor 120a and the driving gate electrode 123.

The gate line (GL) 173 is formed on the passivation film 105, and is connected with the switching gate electrode 133. As described above, although the switching gate electrode 133 is connected with the gate line (GL) 173, since the gate line (GL) 173 is connected with the switching gate electrode 133 in the area other than the cross-section taken along line A-A' of FIG. 4, the connection between the switching gate electrode 132 and the gate line (GL) 173 is now viewable in FIG. 10B.

Finally, as shown in FIG. 5A, a planarization film 106 is formed on the storage capacitor electrode 108 and the passivation film 105, a fifth contact hole H5 is formed on the planarization film 106, and the organic light emitting diode OLED that includes an anode 141, a light emitting layer 142 and a cathode 143 is formed on the planarization film 106.

The anode 141 is connected with the storage capacitor electrode 108 through the fifth contact hole H5. Since the storage capacitor electrode 108 is connected with the driving first conductor 120a, the anode 141 is connected with the driving first conductor 120a.

The organic light emitting diode OLED is surrounded by a bank 107 provided on the planarization film 106, and the pixels may be partitioned by the bank 107.

In the organic light emitting display panel according to an embodiment of the present disclosure, which is manufactured by the above process, each of the switching transistor Tsw1 and the driving transistor Tdr includes a patterned first gate insulating film 151 and a second gate insulating film 104 deposited in a plate shape (e.g., as a common layer), and a gate electrode 153 and an active layer 150c are insulated from each other by the second gate insulating film 104.

Therefore, according to an embodiment of the present disclosure, a step difference in the area where the gate electrode 153 is formed can be reduced.

As a result, the first conductor 150a and the second conductor 150b provided at both ends of the active layer 150c can be prevented from being short-circuited from the gate electrode 153, and various electrodes provided on the passivation film 105 covering the gate electrode 153 can be prevented from being disconnected in the area where the step difference is formed.

Also, according to an embodiment of the present disclosure, since the storage capacitor Cst can be formed in the driving transistor Tdr, which includes the first conductor 150a and the gate electrode 153, by using the first conductor 150a and the gate electrode 153. Therefore, storage capacitance in the driving transistor Tdr can be increased.

Also, according to the structure of the present disclosure as above, the number of contact holes can be reduced as compared with the related art, whereby an aperture ratio of the organic light emitting display panel can be increased.

Also, according to an embodiment of the present disclosure, the number of contact holes can be reduced, whereby the arrangement structure of the pixel driver PD of each pixel can be simplified. Since the storage capacitor Cst can additionally be formed in a space remaining due to simplification of the arrangement structure and omission of a bridge, storage capacitance can be increased, whereby performance of the driving transistor Tdr and performance of the compensation circuit can be improved.

As described above, according to embodiments of the present disclosure, the following effects and advantages can be obtained.

According to an embodiment of the present disclosure, the active layer is generated and covered by the patterned first gate insulating film, and the gate electrode and the active layer are insulated from each other through the second gate insulating film deposited in a plate shape, whereby the step difference in the area where the gate electrode is formed can be reduced.

Therefore, the first conductor and the second conductor provided at both ends of the active layer can be prevented from being short-circuited from the gate electrode, and the electrodes provided on the insulating film covering the gate electrode can be prevented from being disconnected in the area where the step difference is formed.

Also, according to an embodiment of the present disclosure, in the driving transistor that includes the first conductor and the gate electrode, the storage capacitor can be formed using the first conductor and the gate electrode. Therefore, storage capacitance in the driving transistor can be increased.

Also, according to the structure described as above, the number of contact holes can be reduced as compared with the related art, whereby an aperture ratio of the organic light emitting display panel can be increased.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display panel comprising:
   a substrate;
   a plurality of pixels disposed on the substrate;
   a driving transistor for driving at least one of the plurality of pixels, the driving transistor including:
      a driving active layer,
      a driving gate electrode overlapping with the driving active layer,
      a driving first conductor extended from one end of the driving active layer,
      a driving second conductor extended from the other end of the driving active layer, and
      a driving first gate insulating film overlapping with the driving active layer;
   a switching transistor electrically connected to the driving transistor, the switching transistor including:
      a switching active layer,
      a switching gate electrode overlapping with the switching active layer,
      a switching first conductor extended from one end of the switching active layer,
      a switching second conductor extended from the other end of the switching active layer, and
      a switching first gate insulating film overlapping with the switching active layer;
   an organic light emitting diode electrically connected to the driving transistor; and
   a second gate insulating film disposed between the driving and switching gate electrodes of the driving and switching transistors, and the driving first conductor, the driving second conductor, the driving first gate insulating film, the switching first conductor, the switching second conductor and the switching first gate insulating film,
   wherein lowermost surfaces of the driving and switching gate electrodes contact an uppermost surface of the second gate insulating film, and
   wherein uppermost surfaces of the driving first conductor, the driving second conductor, the driving first gate insulating film, the switching first conductor, the switching second conductor and the switching first gate insulating film contact a lowermost surface of the second gate insulating film.

2. The organic light emitting display panel according to claim 1, wherein the switching active layer and the driving active layer are made of a same material and located on a same layer,
- wherein the driving first conductor, the driving second conductor, the switching first conductor and the switching second conductor are made of a same material,
- wherein the driving first gate insulating film and the switching first gate insulating film are made of a same material, and
- wherein the driving gate electrode and the switching gate electrode are made of a same material.

3. The organic light emitting display panel according to claim 1, wherein the driving gate electrode and the driving first conductor are overlapped with each other, and
- wherein the second gate insulating film is disposed between the driving gate electrode and the driving first conductor.

4. The organic light emitting display panel according to claim 1, wherein the second gate insulating film is disposed across an entire surface of a display area of the organic light emitting display panel in a plate shape or a sheet shape, and
- wherein the second gate insulating film covers the driving first gate insulating film in the driving transistor and the switching first gate insulating film in the switching transistor.

5. The organic light emitting display panel according to claim 4, wherein the driving gate electrode of the driving transistor is electrically connected to the switching second conductor of the switching transistor through a first contact hole in the second gate insulating film.

6. The organic light emitting display panel according to claim 1, further comprising:
- a passivation film disposed on the driving transistor and the switching transistor;
- a planarization film disposed on the passivation film;
- a storage capacitor electrically connected between the driving gate electrode of the driving transistor and the organic light emitting diode; and
- a first storage capacitor electrode of the storage capacitor disposed on the passivation film, the first storage capacitor electrode being overlapped with the driving gate electrode of the driving transistor,
- wherein a portion of the driving gate electrode forms a second storage capacitor electrode of the storage capacitor, and
- wherein the first storage capacitor electrode is electrically connected to the driving first conductor of the driving transistor through a second contact hole in the passivation film and a third contact hole in the second gate insulating film.

7. The organic light emitting display panel according to claim 6, wherein the first storage capacitor electrode electrically connects the driving first conductor of the driving transistor with the organic light emitting diode, and
- wherein the driving gate electrode bends around at least one of the second contact hole or the third contact hole.

8. The organic light emitting display panel according to claim 1, further comprising:
- a light shield for shielding light disposed in an area of the substrate, which corresponds to the driving transistor, wherein the driving active layer, the driving first conductor and the driving second conductor are disposed on a buffer layer and overlap with the light shield.

9. The organic light emitting display panel according to claim 8, wherein the driving first conductor of the driving transistor is electrically connected with the light shield through a fourth contact hole in the buffer layer.

10. An organic light emitting display apparatus comprising:
- a substrate;
- a plurality of pixels disposed on the substrate;
- a driving transistor for driving at least one of the plurality of pixels, the driving transistor including:
  - a driving active layer,
  - a driving gate electrode overlapping with the driving active layer,
  - a driving first conductor extended from one end of the driving active layer,
  - a driving second conductor extended from the other end of the driving active layer, and
  - a driving first gate insulating film overlapping with the driving active layer;
- a switching transistor electrically connected to the driving transistor, the switching transistor including:
  - a switching active layer,
  - a switching gate electrode overlapping with the switching active layer,
  - a switching first conductor extended from one end of the switching active layer,
  - a switching second conductor extended from the other end of the switching active layer, and
  - a switching first gate insulating film overlapping with the switching active layer;
- an organic light emitting diode electrically connected to the driving transistor;
- a second gate insulating film disposed under the driving and switching gate electrodes of the driving and switching transistors, and the second gate insulating film being disposed over the driving first conductor, the driving second conductor, the driving first gate insulating film, the switching first conductor, the switching second conductor and the switching first gate insulating film;
- a gate driver configured to supply a gate pulse to gate lines in the organic light emitting display panel;
- a data driver configured to supply a data voltage to data lines in the organic light emitting display panel; and
- a controller configured to control the gate driver and the data driver,
- wherein lowermost surfaces of the driving and switching gate electrodes contact an uppermost surface of the second gate insulating film, and
- wherein uppermost surfaces of the driving first conductor, the driving second conductor, the driving first gate insulating film, the switching first conductor, the switching second conductor and the switching first gate insulating film contact a lowermost surface of the second gate insulating film.

11. The organic light emitting display panel according to claim 10, wherein the switching active layer and the driving active layer are made of a same material and located on a same layer,
- wherein the driving first conductor, the driving second conductor, the switching first conductor and the switching second conductor are made of a same material,
- wherein the driving first gate insulating film and the switching first gate insulating film are made of a same material, and
- wherein the driving gate electrode and the switching gate electrode are made of a same material.

12. The organic light emitting display apparatus according to claim 10, wherein the driving gate electrode and the driving first conductor are overlapped with each other, and
   wherein the second gate insulating film is disposed between the driving gate electrode and the driving first conductor.

13. The organic light emitting display apparatus according to claim 10, wherein the second gate insulating film is disposed across a display area of the organic light emitting display panel in a plate shape or a sheet shape, and
   wherein second gate insulating film covers the driving first gate insulating film in the driving transistor and the switching first gate insulating film in the switching transistor.

14. The organic light emitting display apparatus according to claim 13, wherein the driving gate electrode of the driving transistor is electrically connected with the switching second conductor of the switching transistor through a first contact hole in the second gate insulating film.

15. The organic light emitting display apparatus according to claim 10, further comprising:
   a storage capacitor electrically connected between the driving gate electrode of the driving transistor and the organic light emitting diode;
   a passivation film disposed on the driving transistor and the switching transistor;
   a planarization film disposed on the passivation film; and
   a first storage capacitor electrode of the storage capacitor disposed on the passivation film, the first storage capacitor electrode being overlapped with the driving gate electrode of the driving transistor,
   wherein a portion of the driving gate electrode forms a second storage capacitor electrode of the storage capacitor, and
   wherein the first storage capacitor electrode is electrically connected with the driving first conductor of the driving transistor through a second contact hole in the passivation film and a third contact hole in the second gate insulating film.

16. The organic light emitting display apparatus according to claim 15, wherein the first storage capacitor electrode electrically connects the driving first conductor of the driving transistor with the organic light emitting diode, and
   wherein the driving gate electrode bends around at least one of the second contact hole or the third contact hole.

17. The organic light emitting display apparatus according to claim 10, further comprising:
   a light shield for shielding light disposed in an area of the substrate, which corresponds to the driving transistor,
   wherein the driving active layer, the driving first conductor and the driving second conductor are disposed on a buffer layer and overlap with the light shield.

18. The organic light emitting display apparatus according to claim 17, wherein the driving first conductor of the driving transistor is electrically connected with the light shield through a fourth contact hole in the buffer layer.

* * * * *